US011762305B2

(12) United States Patent
Sokolov et al.

(10) Patent No.: US 11,762,305 B2
(45) Date of Patent: Sep. 19, 2023

(54) ALIGNMENT METHOD (71) Applicant: ASML Netherlands B.V., Veldhoven (NL)

(72) Inventors: Sergei Sokolov, Eindhoven (NL); Filippo Alpeggiani, Eindhoven (NL); Sebastianus Adrianus Goorden, Eindhoven (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/782,570

(22) PCT Filed: Nov. 16, 2020

(86) PCT No.: PCT/EP2020/082170
§ 371 (c)(1),
(2) Date: Jun. 3, 2022

(87) PCT Pub. No.: WO2021/110391
PCT Pub. Date: Jun. 10, 2021

(65) Prior Publication Data
US 2022/0382175 A1 Dec. 1, 2022

(30) Foreign Application Priority Data

Dec. 5, 2019 (EP) .................................... 19213963

(51) Int. Cl.
*G03F 9/00* (2006.01)
(52) U.S. Cl.
CPC .......... *G03F 9/7088* (2013.01); *G03F 9/7065* (2013.01); *G03F 9/7092* (2013.01)

(58) Field of Classification Search
CPC .. G03F 7/70633; G03F 9/7065; G03F 9/7088; G03F 9/7092; G03F 9/7069
See application file for complete search history.

(56) References Cited

U.S. PATENT DOCUMENTS

| 4,155,630 A | 5/1979 | Ih |
| 5,029,975 A | 7/1991 | Pease |

(Continued)

FOREIGN PATENT DOCUMENTS

| WO | WO 2009/078708 A1 | 6/2009 |
| WO | WO 2009/106279 A1 | 9/2009 |

(Continued)

OTHER PUBLICATIONS

International Search Report and Written Opinion of the International Searching Authority directed to related International Patent Application No. PCT/EP2020/082170, dated Apr. 19, 2021; 8 pages.

(Continued)

*Primary Examiner* — Peter B Kim
(74) *Attorney, Agent, or Firm* — Sterne, Kessler, Goldstein & Fox P.L.L.C.

(57) ABSTRACT

Disclosed is a method for determining a stage position or correction therefor in a lithographic process. The method comprises obtaining transmission data describing the transmission of alignment radiation onto the substrate; obtaining position data relating to a stage position of said stage and/or a sensor position of said sensor. A weighting is determined for the position data based on said transmission data. The position based on said transmission data, position data and weighting.

15 Claims, 8 Drawing Sheets

(56) References Cited

U.S. PATENT DOCUMENTS

| | | | |
|---|---|---|---|
| 6,061,133 | A | 5/2000 | Freischlad |
| 6,556,290 | B2 | 4/2003 | Maeda et al. |
| 6,621,571 | B1 | 9/2003 | Maeda et al. |
| 6,628,406 | B1 | 9/2003 | Kreuzer |
| 6,961,116 | B2 | 11/2005 | Den Boef et al. |
| 10,527,958 | B2 | 1/2020 | Tinnemans et al. |
| 2002/0048026 | A1 | 4/2002 | Isshiki et al. |
| 2005/0207160 | A1 | 9/2005 | Babayoff et al. |
| 2006/0033921 | A1 | 2/2006 | Den Boef et al. |
| 2006/0066855 | A1 | 3/2006 | Boef et al. |
| 2006/0241894 | A1* | 10/2006 | Matsumoto ............ G03F 9/7003 702/150 |
| 2007/0041015 | A1 | 2/2007 | Van Bilsen |
| 2008/0304128 | A1 | 12/2008 | Busker et al. |
| 2009/0195768 | A1 | 8/2009 | Bijnen et al. |
| 2010/0079848 | A1 | 4/2010 | Grasser et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2014/0240951 | A1 | 8/2014 | Brady et al. |
| 2015/0015879 | A1 | 1/2015 | Papadopoulos et al. |
| 2015/0116717 | A1 | 4/2015 | Manassen et al. |
| 2015/0261097 | A1 | 9/2015 | Mathijssen et al. |
| 2018/0106723 | A1 | 4/2018 | Manassen et al. |
| 2018/0129140 | A1 | 5/2018 | Cramer et al. |
| 2018/0203250 | A1 | 7/2018 | Lippey et al. |

FOREIGN PATENT DOCUMENTS

| | | |
|---|---|---|
| WO | WO 2013/178422 A1 | 12/2013 |
| WO | WO 2018/095705 A1 | 5/2018 |
| WO | WO 2020/057900 A1 | 3/2020 |

OTHER PUBLICATIONS

International Preliminary Report on Patentability directed to related International Patent Application No. PCT/EP2020/082170, dated May 17, 2022; 6 pages.

Research Disclosure No. 676001, "Metrology Method and Associated Metrology and Lithographic Apparatuses," Jun. 24, 2020; 30 pages.

* cited by examiner

ALIGNMENT METHOD

CROSS-REFERENCE TO RELATED APPLICATIONS

This application claims priority of EP application 19213963.2 which was filed on Dec. 5, 2019 and which is incorporated herein in its entirety by reference.

BACKGROUND

Field of the Invention

The present invention relates to methods and apparatus usable, for example, in the manufacture of devices by lithographic techniques, and to methods of manufacturing devices using lithographic techniques. The invention relates to metrology devices, and more specifically metrology devices used for measuring position such as alignment sensors and lithography apparatuses having such an alignment sensor.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in position metrology using alignment sensors, a complementary stage position monitoring (SPM) sub-system which operates complementarily with the alignment sensor. Such a SPM subsystem monitors the position difference between the stage (a wafer stage/substrate stage and/or reticle stage) and the sensor and determines a correction for positioning and/or movement of the stage. Such a SPM subsystem could monitor the position of the stage, the position of the sensor (or any particular component of the sensor) and any combination thereof. It is desirable to provide or adapt such an SPM subsystem for other types of alignment sensors.

SUMMARY OF THE INVENTION

The invention in a first aspect provides a method for determining a position of a target structure on a substrate supported by a stage in an alignment process using a sensor; comprising: obtaining transmission data describing the transmission of alignment radiation onto the substrate; obtaining position data relating to a stage position of said stage and/or a sensor position of said sensor; determining a weighting for the position data based on said transmission data; and determining the position based on said transmission data, position data and weighting.

The invention in a second aspect provides a method for determining a position of a target structure on a substrate supported by a stage in an alignment process using a sensor; comprising: obtaining transmission data describing the transmission of alignment radiation onto the substrate; obtaining position data relating to a stage position of said stage and/or a sensor position of said sensor; tuning the spectral characteristics of the transmission of the alignment radiation such that the transmission of the alignment radiation has improved spectral characteristics with respect to the that of the position data; and determining the position based on said position data.

Also disclosed is a computer program, metrology apparatus and a lithographic apparatus being operable to perform the method of the first and/or second aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which:

FIGS. 6A-6C comprise FIG. 6A a pupil image of input radiation FIG. 6B pupil image of off-axis illumination beams illustrating an operational principle of the metrology device of FIG. 5; and FIG. 6C pupil image of off-axis illumination beams illustrating another operational principle of the metrology device of FIG. 5;

DETAILED DESCRIPTION OF EMBODIMENTS

Before describing embodiments of the invention in detail, it is instructive to present an example environment in which embodiments of the present invention may be implemented.

Figure 1:
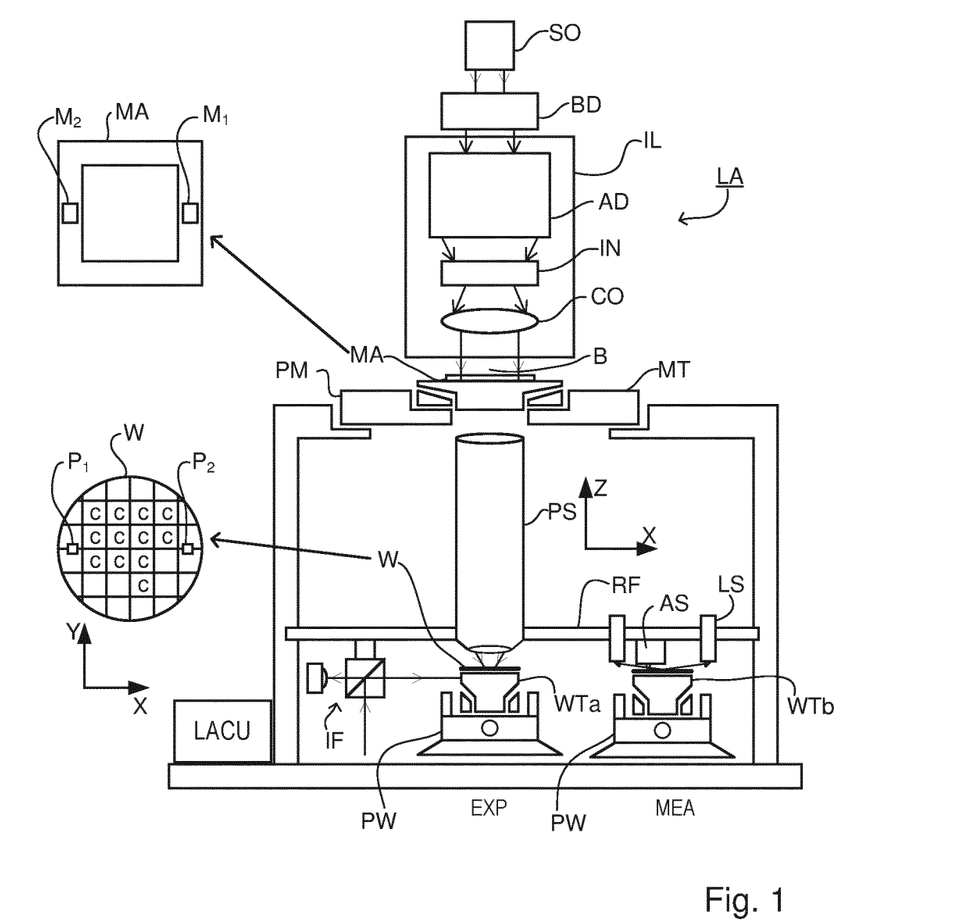
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
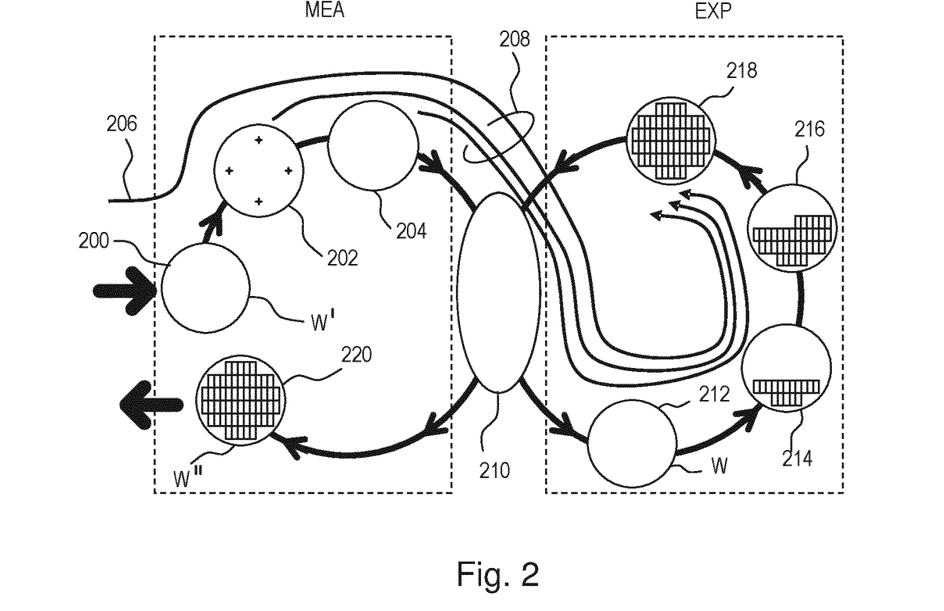
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor may scan each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
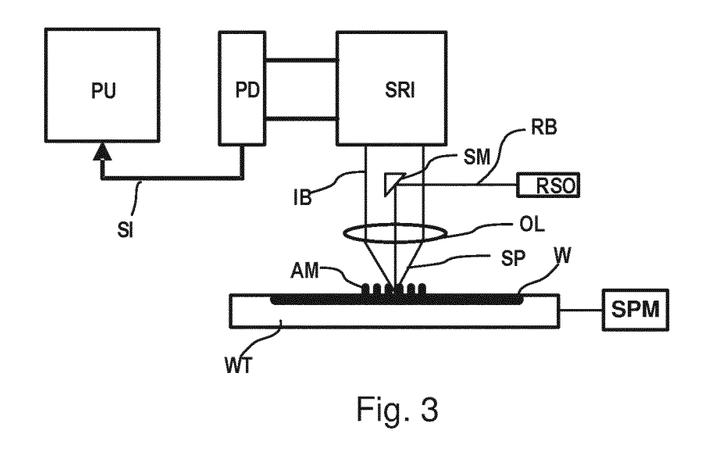
FIG. 3 is a schematic illustration of a first alignment sensor adaptable according to an embodiment.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

A stage position monitoring subsystem SPM is provided for monitoring the position and/or movement of the stage or wafer table WT with respect to an expected position and/or movement. The SPM may, for example, comprise sensors or encoders on the metroframe of the system which measure the stage position. The SPM subsystem will be described in more detail below.

Figure 4:
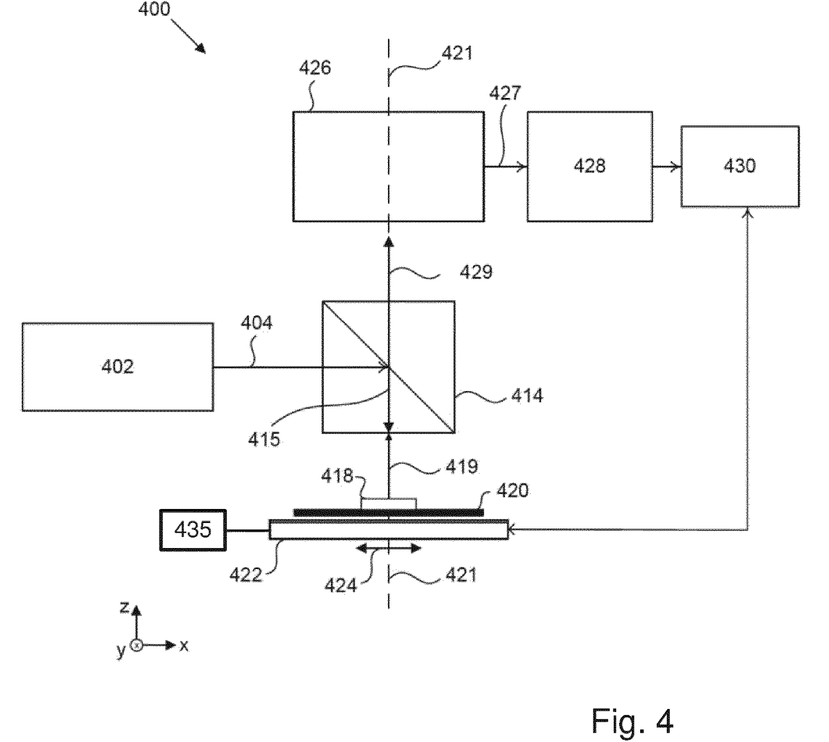
FIG. 4 is a schematic illustration of a second alignment sensor adaptable according to an embodiment.

FIG. 4 illustrates a schematic of a cross-sectional view of another known alignment apparatus 400. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate According to an embodiment, alignment apparatus 400 may include an illumination system 402, a beam splitter 414, an interferometer 426, a detector 428, and a signal analyzer 430, according to an example of this embodiment. Illumination system 402 may be configured to provide an electromagnetic narrow band radiation beam 404 having one or more passbands. In an example, the one or more passbands may be within a spectrum of wavelengths between about 400 nm to about 2.0 µm. In another example, the one or more passbands may be discrete narrow passbands within a spectrum of wavelengths between about 400 nm to about 2.0 µm.

Beam splitter 414 may be configured to receive radiation beam 404 and direct a radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate.

Beam splitter 414 may be further configured to receive diffraction radiation beam 419 and direct diffracted radiation sub-beam 429 towards interferometer 426, according to an embodiment In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. Interferometer 426 may be further configured to rotate one of the two images with respect to the other of the two images 180° and recombine the rotated and unrotated images interferometrically. In some embodiments, the interferometer 426 can be a self-referencing interferometer (SRI), which is disclosed in U.S. Pat. No. 6,628,406 (Kreuzer) and is incorporated by reference herein in its entirety.

In an embodiment, detector 428 may be configured to receive the recombined image via interferometer signal 427 and detect interference as a result of the recombined image when an alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

As in the alignment sensor of FIG. 3, a stage position monitoring subsystem 435 is provided for monitoring the position and/or movement of the stage 422 with respect to an expected position and/or movement.

Another specific type of metrology sensor, which has both alignment and product/process monitoring metrology applications, has recently been recently described in European applications EP18195488.4 and EP19150245.9, which are incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Figure 5:
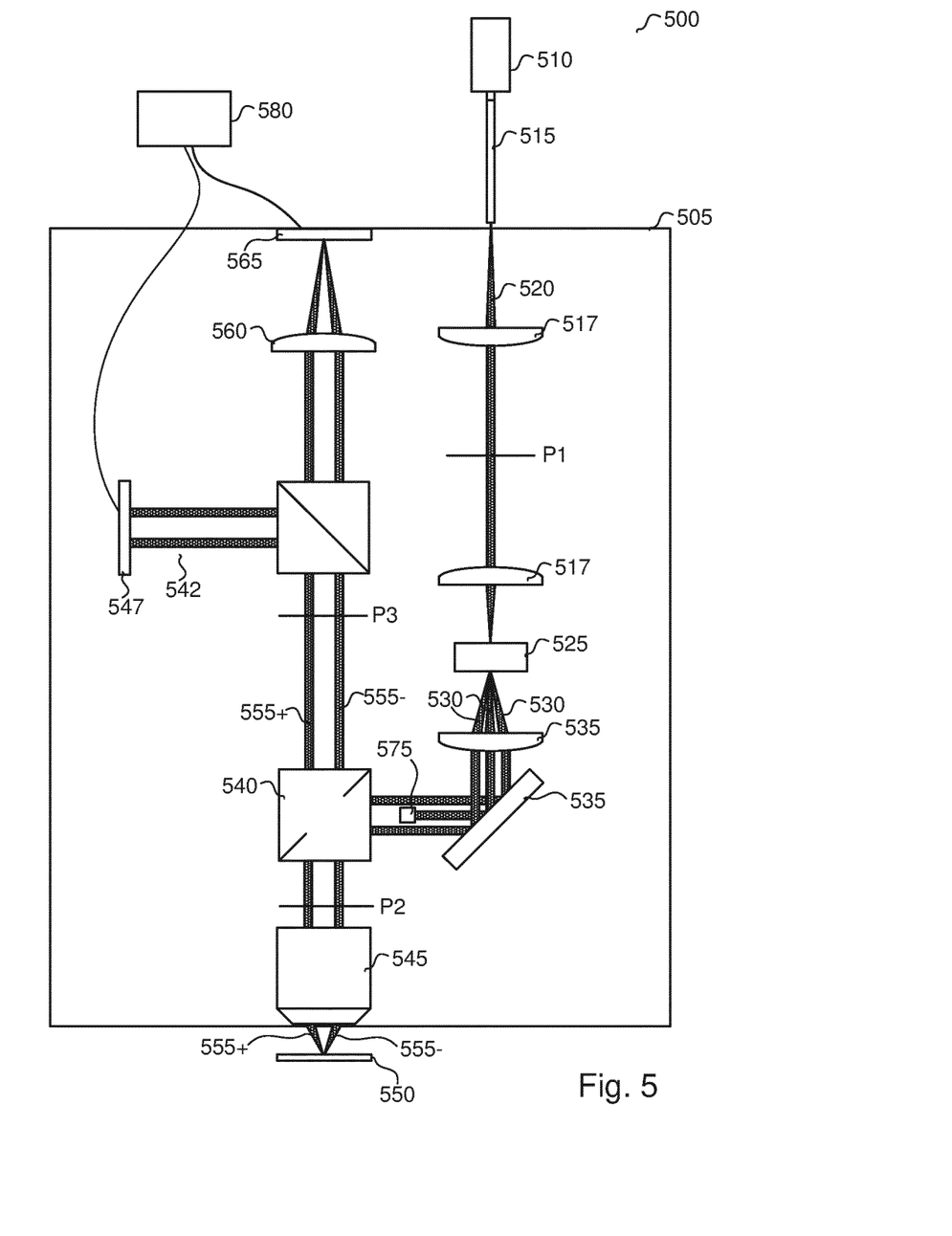
FIG. 5 is a schematic illustration of an alternative metrology device also usable for alignment and adaptable according to an embodiment.

FIG. 5 shows a possible implementation of such a metrology device. The metrology device essentially operates as a standard microscope with a novel illumination mode. The metrology device 500 comprises an optical module 505 comprising the main components of the device. An illumination source 510 (which may be located outside the module 505 and optically coupled thereto by a multimode fiber 515) provides a spatially incoherent radiation beam 520 to the optical module 505. Optical components 517 deliver the spatially incoherent radiation beam 520 to a coherent off-axis illumination generator 525. This component is of particular importance to the concepts herein and will be described in greater detail. The coherent off-axis illumination generator 525 generates a plurality (e.g., four) off-axis beams 530 from the spatially incoherent radiation beam 520. The characteristics of these off-axis beams 530 will be described in detail further below. The zeroth order of the illumination generator may be blocked by an illumination zero order block element 575. This zeroth order will only be present for some of the coherent off-axis illumination generator examples described in this document (e.g., phase grating based illumination generators), and therefore may be omitted when such zeroth order illumination is not generated. The off-axis beams 530 are delivered (via optical components 535 and) a spot mirror 540 to an (e.g., high NA) objective lens 545. The objective lens focusses the off-axis beams 530 onto a sample (e.g., periodic structure/alignment mark) located on a substrate 550, where they scatter and diffract. The scattered higher diffraction orders 555+, 555− (e.g., +1 and −1 orders respectively), propagate back via the spot mirror 540, and are focused by optical component 560 onto a sensor or camera 565 where they interfere to form an interference pattern. A processor 580 running suitable software can then process the image(s) of the interference pattern captured by camera 565.

The zeroth order diffracted (specularly reflected) radiation is blocked at a suitable location in the detection branch; e.g., by the spot mirror 540 and/or a separate detection zero-order block element. It should be noted that there is a zeroth order reflection for each of the off-axis illumination beams, i.e. in the current embodiment there are four of these zeroth order reflections in total. As such, the metrology device operated as a "dark field" metrology device.

In this metrology device, spatial coherence is induced in the measurement illumination only where required. More specifically, spatial coherence is induced between corresponding sets of pupil points in each of the off-axis beams 530. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 530 is spatially incoherent.

Figures 6A, 6B, 6C:
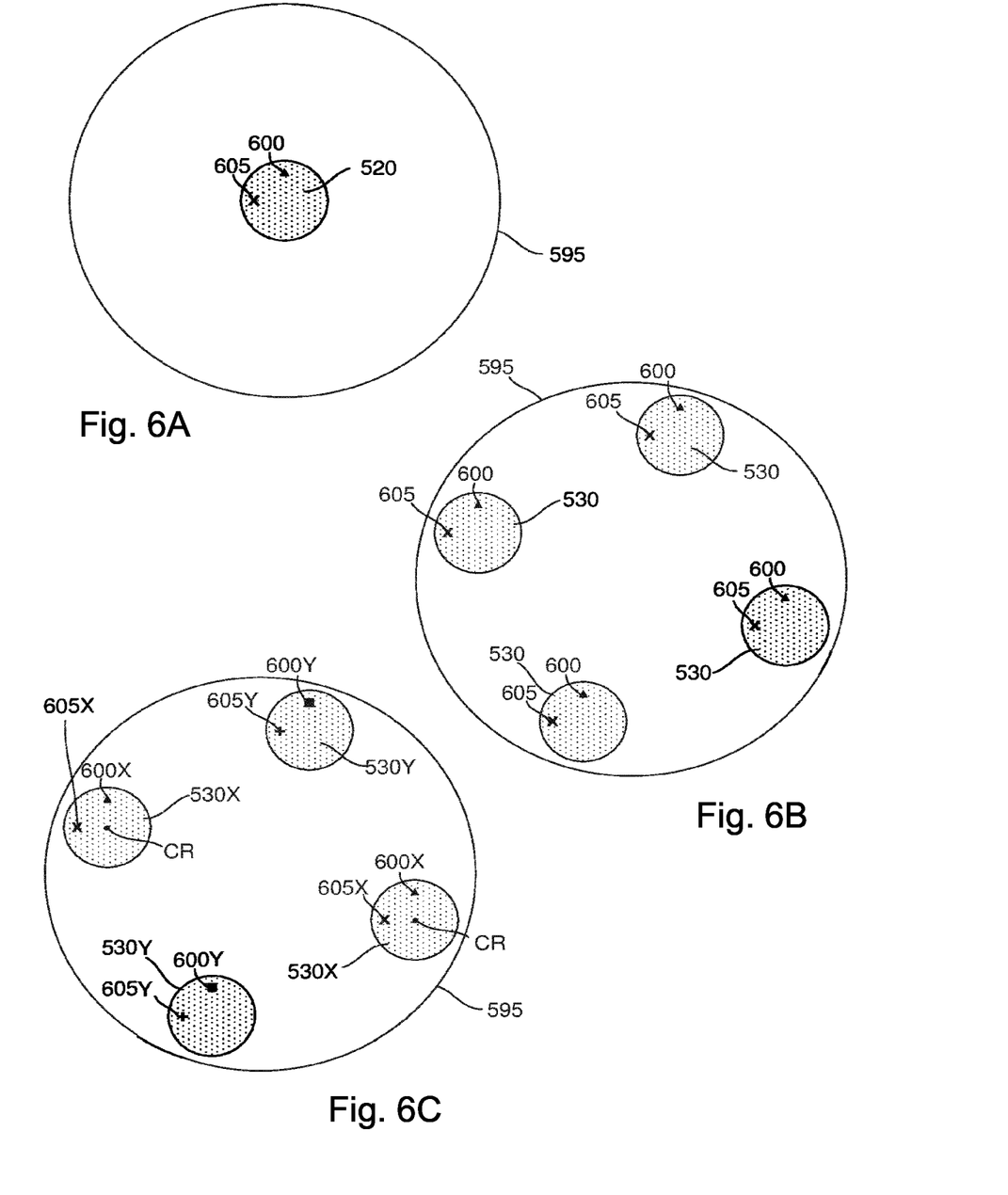

FIG. 6 shows three pupil images to illustrate the concept. FIG. 6(a) shows a first pupil image which relates to pupil plane P1 in FIG. 5, and FIGS. 6(b) and 6(c) each show a second pupil image which relates to pupil plane P2 in FIG. 5. FIG. 6(a) shows (in cross-section) the spatially incoherent radiation beam 520, and FIGS. 6(b) and 6(c) show (in cross-section) the off-axis beams 530 generated by coherent off-axis illumination generator 525 in two different embodiments. In each case, the extent of the outer circle 595 corresponds to the maximum detection NA of the microscope objective; this may be, purely by way of an example 0.95 NA.

The triangles 600 in each of the pupils indicate a set of pupil points that are spatially coherent with respect to each other. Similarly, the crosses 605 indicate another set of pupil points which are spatially coherent with respect to each other. The triangles are spatially incoherent with respect to crosses and all other pupil points corresponding to beam propagation. The general principle (in the example shown in FIG. 6(b)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 6(b), the spacing between each pupil point of the first coherent set of points represented by triangles 600 must be equal to the spacing between each pupil point of the coherent set of points represented by crosses 605. 'Spacing' in this context is directional, i.e., the set of crosses (second set of points) is not allowed to be rotated with respect to the set of triangles (first set of points). As such, each of the off-axis beams 530 comprises by itself incoherent radiation; however the off-axis beams 530 together comprise identical beams having corresponding sets of points within their cross-section that have a known phase relationship (spatial coherence). It should be noted that it is not necessary for the points of each set of points to be equally spaced (e.g., the spacing between the four triangles 605 in this example is not required to be equal). As such, the off-axis beams 530 do not have to be arranged symmetrically within the pupil.

FIG. 6(c) shows that this basic concept can be extended to providing for a mutual spatial coherence between only the beams corresponding to a single measurement direction where beams 530X correspond to a first direction (X-direction) and beams 530Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 6(c), the off-axis beams are only pair-wise coherent.

In this embodiment, the off-axis beams are considered separately by direction, e.g., X direction 530X and Y direction 530Y. The pair of beams 530X which generate the captured X direction diffraction orders need only be coherent with one another (such that pair of points 600X are mutually coherent, as are pair of points 605X). Similarly the pair of beams 530Y which generate the captured Y direction diffraction orders need only be coherent with one another (such that pair of points 600Y are mutually coherent, as are pair of points 605Y). However, there does not need to be coherence between the pairs of points 600X and 600Y, nor between the pairs of points 605X and 605Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

In some devices such as a metrology device illustrated in FIG. 5, single and multimode coherent light sources cannot be used for illumination because they produce very inhomogeneous illumination. However, coherent sources have the virtue of often being very bright. Therefore an incoherent source for such a metrology device may comprise a coherent source and a coherence scrambling arrangement to scramble the output of the coherent source.

Figure 7A:
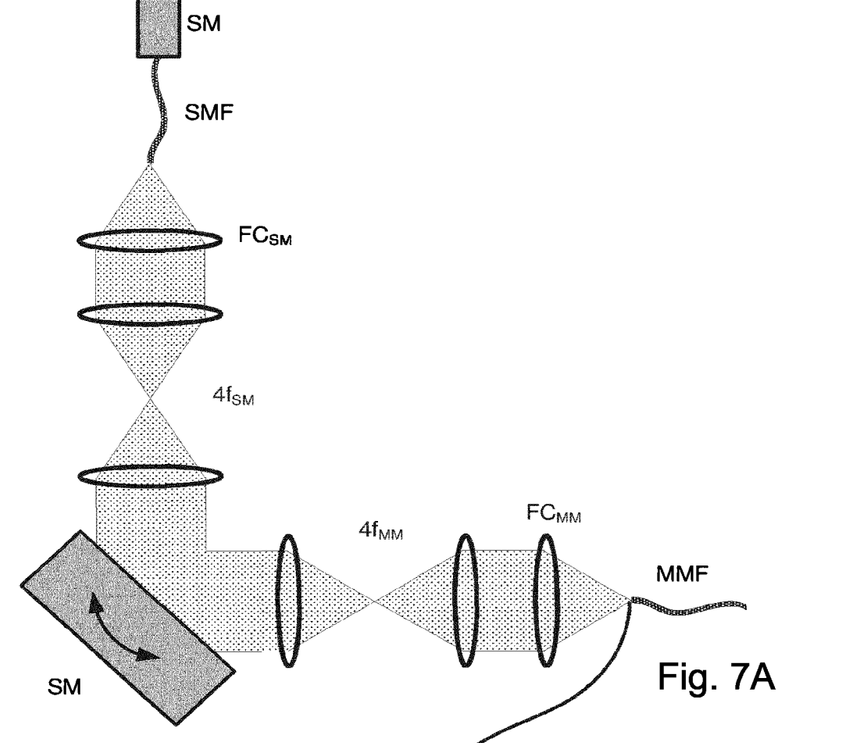
FIG. 7 is an exemplary illumination source arrangement for a metrology device such as illustrated in FIG. 5.
Figure 7B:
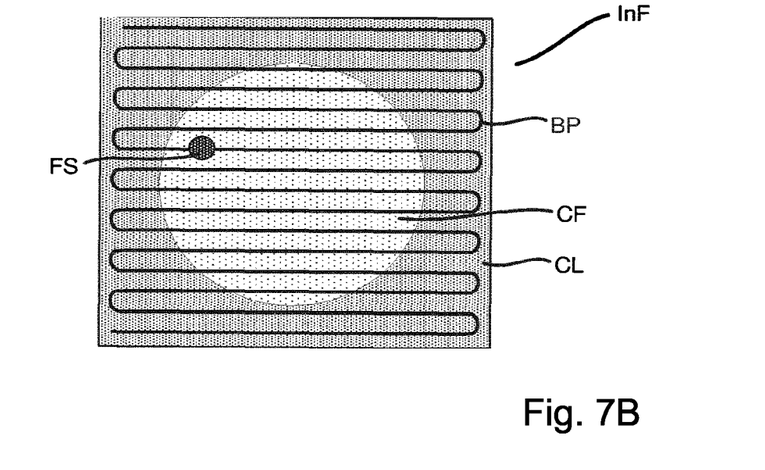

FIG. 7 shows a coherence scrambling arrangement suitable for converting the output of a spatially coherent source so as to be effectively a spatially incoherent (or pseudo incoherent) source. The main principle comprises moving the focus spot FS from a coherent source CS over the core input facet InF of a multimode fiber MF. FIG. 7(a) shows a simplified schematic of such an arrangement and FIG. 7(b) shows a plane representation of the input facet InF of a multimode fiber MF; the input facet InF comprising the core facet CF (lighter shaded circle) and, outside of this, a fiber cladding CL and surrounding ferrule or other coating (darker shaded region).

The specific arrangement shows a single mode fiber SMF transporting radiation from an incoherent source IS. Intervening optics transport this radiation, via a scanning mirror SM (e.g., galvanic mirror) spatial light modulator SLM or other scanning component to a multimode fiber MMF. In the specific arrangement illustrated, intervening optics comprise a fiber collimator $FC_{SM}$ and imaging system (e.g., a 4f imaging system) $4f_{SM}$ to transport the beam from the single mode fiber SMF to the scanning mirror SM, and a similar arrangement $FC_{MM}$, $4f_{MM}$ to transport the beam to the multimode fiber MMF.

Using such an arrangement, the coherence scrambling may be made controllable by focusing the coherent source CS output on the facet InF of the multimode fiber MMF and scanning the spot FS over the input facet InF, so as to scan over the fiber core facet CF using the scanning mirror SM or other scanning device which can scan the focused spot. FIG. 7(b) shows an exemplary beam path BP of the focused spot FS, where the spot FS is scanned according to a meander or zig-zag over the input facet InF.

The NA of the multimode fiber MMF may be matched to the illumination NA of the coherence scrambler output and the full core of the fiber may be scanned homogeneously during a single frame integration time of the camera of the system (not shown). In this way, during this homogeneous scanning, all fiber modes are addressed equally, and speckle contrast is minimized for a given fiber.

Lithographic apparatuses may comprise a complementary stage position monitoring (SPM) sub-system which operates complementarily with the alignment sensor. Such a SPM subsystem monitors the position of a stage (a wafer stage/substrate stage and/or reticle stage) and determines a correction for positioning and/or movement of the stage compared to where it should be (sensor feedback during movement). This correction takes into account the fact that the stage, when set to stand still at a particular position or move at a certain speed, will not necessarily follow the requested positions/movement (e.g., as determined using the alignment sensor measuring alignment marks on the wafer) exactly; instead there will be some variation around the set value. This variation may be measured by SPM encoders (or other sensors) on, for example, a metrology frame of the system. The resultant variation data fed into an alignment position algorithm to improve the alignment accuracy.

In addition, the alignment sensor itself is not completely stationary, which can also affect the measured alignment position. An ARA (alignment reference axis) sensor may be provided to measure the alignment sensor position and this information combined into the SPM correction.

As such, position data within the context of this disclosure may comprise stage position data (e.g., as measured by SPM subsystem), and/or sensor position data (e.g., as measured by an ARA); this may include any combination of stage position data or sensor position data. The position data may describe a relative position difference between the sensor and the stage.

SPM subsystems as described have been developed for metrology or alignment sensors such as those illustrated in FIGS. 3 and 4. However, to use an equivalent SPM subsystem for an optimized coherence metrology system such as illustrated in FIG. 5 requires a different correction strategy than used presently. Additionally, the current SPM correction scheme developed for the other sensor arrangements (e.g., FIGS. 3 and 4) may not be necessarily suitable for use with an optimized coherence metrology system due to the significant difference between sensors; in particular differences in how their respective sources operate.

As has been described, an incoherent metrology system may use an incoherent source, and this incoherence may be obtained by coherence scrambling of coherent illumination; e.g., by using a source arrangement such as illustrated in FIG. 7. Referring back to FIG. 7(b), when laser spot FS is incident on the fiber core CF it will be transmitted through the fiber efficiently. When spot is incident outside of the core (e.g., on fiber cladding/ferule CL), the transmission will be much lower or even zero. This means that alignment measurement will only be sensitive to the portion of the SPM data corresponding to the spot FS being incident on the fiber core CF; i.e., the SPM data which was captured during the time when the laser spot was on the fiber core (or sufficiently near it for good transmission), such that light from the source reaches the wafer and subsequently the camera/detector.

It is therefore proposed to account for the source behavior of a metrology or alignment sensor to provide an improved SPM correction. This may comprise accounting for the time during which the alignment sensor is transmitting little or no light to the wafer. Such a method may comprise weighting the SPM data (e.g., data from SPM sensors and/or output data from SPM algorithms) depending on the transmission of the alignment sensor source illumination to the wafer. This may be achieved by weighting the SPM data with a weighting source function. The weighting source function may be largely binary in nature; e.g., switching between 0% weight and 100% weight depending on whether illumination is being transmitted or not. Alternatively other weighting functions may be used, e.g., having some gradient between 0% weight and 100% weight to correspond to the situation where there is partial illumination transmission as the spot transitions from being incident on core to surround and vice versa. These are only two examples of weighting functions, and other weighting functions are possible.

Figure 8A:
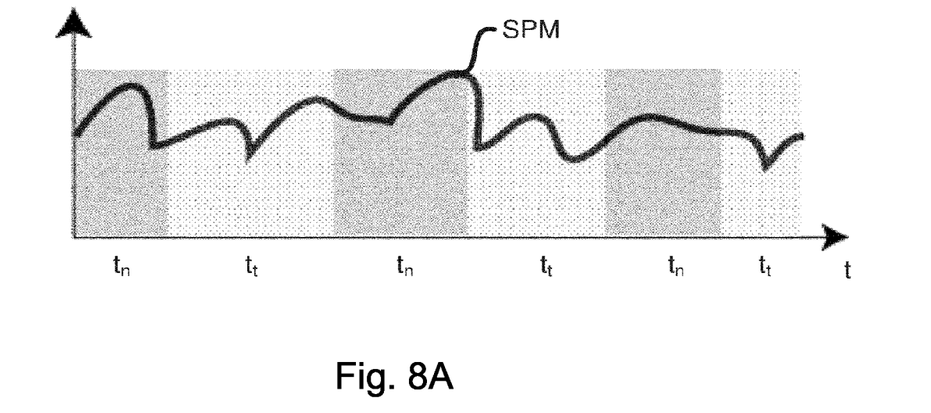
FIGS. 8A-8B time plots of FIG. 8A a stage position monitoring signal and FIG. 8B a weighting function according to an embodiment, for the stage position monitoring signal.
Figure 8B:
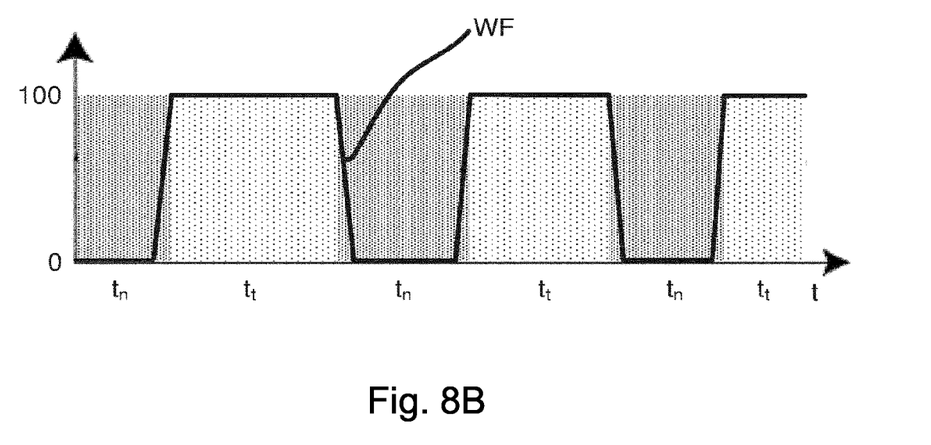

FIG. 8(a) shows an exemplary SPM data trace SPM with arbitrary units on the y-axis against time t on the x-axis. The SPM data may be SPM sensor data (e.g., an intensity magnitude) from one or more sensors (e.g., encoders) or SPM control data (e.g., a setpoint position or velocity value) as determined by an SPM algorithm based on SPM sensor data. The time t is divided (by the shading) into durations $t_t$ where the alignment sensor is transmitting illumination to the wafer (corresponding to the focus spot FS being incident on the core CF) and durations $t_n$ where there is little or no illumination transmitted to the wafer (corresponding to the focus spot FS being incident on the cladding CL). FIG. 8(b) shows a trace of an exemplary weighting source function WF, with weighting on the y axis (0-100%) and time on the x axis. The time axis is again divided into the same durations $t_t$ where the alignment sensor is transmitting illumination to the wafer and $t_n$ where it is not (or transmission is very low). Such a weighting source function WF may be used to weight the SPM data trace shown in FIG. 8(a) (weighting may be used to e.g. calculate the mean position). In this way, the SPM correction is being determined predominately (or entirely) from SPM data corresponding to periods where the wafer is receiving alignment illumination, with SPM data recorded outside of these time periods being weighted against or discarded entirely.

The weighting source function WF can be determined, for example, using one or more of the following measurements or methods (this list not being exhaustive):

1) The weighting source function can be determined via simulation; e.g., by using a light source model which simulates the radiation characteristics (e.g., transmission/reflection) from the source.
2) In the light source module the reflection from the fiber facet can be measured. Therefore, one such embodiment may comprise determining whether reflection from the fiber facet is low, indicative of light being transmitted to the alignment optical module; or the reflection is high, indicative of light not being transmitted to the alignment optical module.
3) A fiber beamsplitter or other light tap and associated detector (e.g., photodiode) may be provided to create a power/intensity pick-off on the separate detector. In this way, the amount of light being transmitted into the multimode fiber may be directly measured.
4) As light source module is expected to be operated in a repeatable fashion (repetitions of the same scanning path), then this weighting source function WF function can be measured offline (e.g., once or averaged over a number of scans) at the fiber end (e.g., in a calibration), prior to coupling of the fiber into the optical module. This approach has a slight disadvantage over the others that it cannot account for source power variation over time.
5) A pick-off branch may be located inside the alignment sensor (e.g., at the output of the multimode fiber); e.g., comprising a dedicated detector (e.g., photodiode). In this way, the amount of light being transmitted by the multimode fiber into the alignment sensor may be directly measured.

A further advantage of this concept, for embodiments where the intensity is measured online (e.g., embodiments 3 and 5 in the preceding paragraph) is that the weighting source function may account and mitigate light source intensity variation/fluctuation. As such, it is proposed that the weighting source function determination algorithm may take into account said light source intensity variation/fluctuation data if available.

A further embodiment, which may be implemented independently or in combination with the above described embodiment, may comprise actively tuning existing components or adding tunable elements in the source or the sensor so as to vary spectral characteristics of the alignment signal (or the alignment source signal), such that it has improved spectral characteristics with respect to the SPM signal. It has been observed that the SPM signal is often dominated by a one or more spectral frequencies. To address this, periodic or quasiperiodic modulators can be used to modify the spectral contents of the alignment signal to either reduce crosstalk with the SPM signal and/or match the signals such that the alignment signal is "locked in" with the SPM signal, depending on the particular application.

The spectral content of the alignment signal can be modified, for example, by adding one or more periodic modulators along the optical path (a hardware modification), and/or by tuning the scanning speed of the laser on the core facet in the coherence scrambler (no hardware modification needed, but not exactly a periodic signal).

Figure 9A:
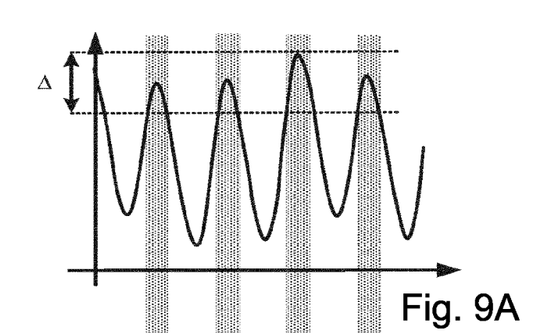
FIGS. 9A-9C comprise FIG. 9A a time plot of a stage position monitoring signal FIG. 9B a corresponding spectral plot of the a stage position monitoring signal, FIG. 9C a time plot of the transmission characteristic of the metrology device and FIG. 9D a corresponding spectral plot of the transmission characteristic.
Figure 9B:
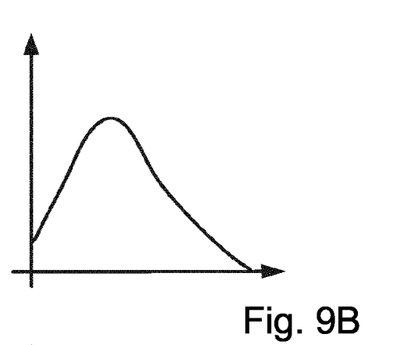
Figure 9C:
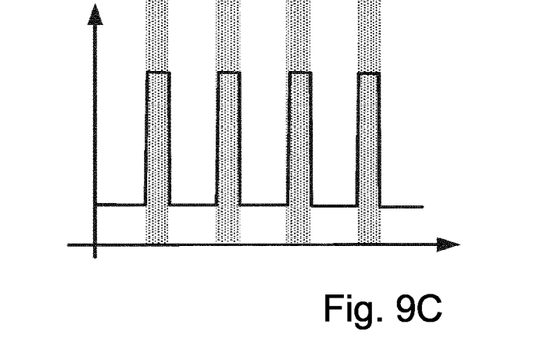
Figure 9D:
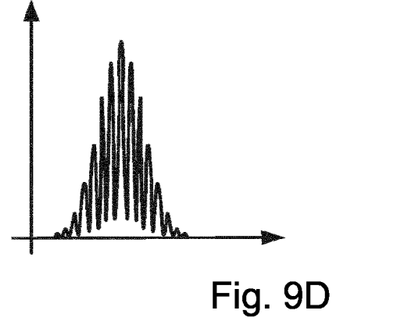

It is proposed, in an embodiment, to aim to make the main spectral frequency of the on/off temporal illumination signal coincide with the main spectral frequency of the SPM. In this way, the camera should receive light in phase with a particular position of the stage. FIG. 9 illustrates this conceptually. FIG. 9(a) is a plot of an SPM (e.g., control or correction) signal against time t and FIG. 9(b) is a corresponding frequency spectrum plot (frequency f on the x axis). FIG. 9(c) is a plot of the corresponding transmission signal plot (intensity I transmitted to wafer vs. time t) and FIG. 9(d) is a corresponding frequency spectrum plot.

Effectively, the modulator or the coherence scrambler is being used to "lock in" on the SPM signal. This technique can drastically decrease the impact of SPM on repro, because, instead of averaging over the whole SPM variation, the averaging is being done over a smaller sub-range of this variation (exemplified by the interval A in FIG. 9(a)).

Other aspects of the invention are set-out as in the following numbered clauses.

1. A method for determining a position of a target structure on a substrate supported by a stage in an alignment process using a sensor; comprising:
obtaining transmission data describing the transmission of alignment radiation onto the substrate;
obtaining position data relating to a stage position of said stage and/or a sensor position of said sensor;
determining a weighting for the position data based on said transmission data; and
determining the position based on said transmission data, position data and weighting.
2. A method as claimed in clause 1, wherein the position data relates to a correction for positioning and/or movement of the stage with respect to an expected position and/or movement.
3. A method as claimed in clause 2, wherein the expected position and/or movement is determined in said alignment process.
4. A method as claimed in any preceding clause, wherein the weighting weights against said position data corresponding to time periods for which alignment radiation is not being transmitted onto the substrate.
5. A method as claimed in any preceding clause, wherein alignment radiation is transmitted to said substrate via a multimode fiber by scanning a focused radiation beam over an input facet of the multimode fiber to scramble spatial coherence of the radiation beam, said scanning including periods where the focused radiation beam is incident outside of a core region of the input facet.
6. A method as claimed in clause 5, wherein said obtaining transmission data comprises determining the transmission data via simulation using a light source model of the alignment radiation.
7. A method as claimed in clause 5, wherein said obtaining transmission data comprises directly measuring the amount of light being transmitted through the fiber and/or reflected from the fiber using a detector.

8. A method as claimed in clause 7, wherein the direct measurement is via a light tap in the multimode fiber.

9. A method as claimed in clause 7, wherein the direct measurement is via a branch downstream of an output of the multimode fiber.

10. A method as claimed in clause 7, 8 or 9, comprising accounting for source intensity variation when determining said weighting.

11. A method as claimed in clause 5, wherein said obtaining transmission data comprises measuring the transmission data offline by measuring the transmission at an output of the multimode fiber when not connected.

12. A method as claimed in any of clauses 5 to 11, further comprising tuning the spectral characteristics of said transmission of the alignment radiation such that the transmission of the alignment radiation has improved spectral characteristics with respect to that of the position data.

13. A method as claimed in clause 12, wherein said tuning the spectral characteristics of the alignment radiation is such that a principal spectral frequency of the transmission of the alignment radiation is better matched to a principal spectral frequency of the position data.

14. A method as claimed in clause 12 or 13, wherein said tuning comprises modulating the alignment radiation using one or more modulators within a path of the alignment radiation.

15. A method as claimed in clause 12 or 13, wherein said tuning comprises tuning the scanning speed of the focused radiation beam on the input facet.

16. A method as claimed in clause 15, comprising correcting an accuracy error for said tuning resultant from a phase difference between the position data and the scanning speed.

17. A method for determining a position of a target structure on a substrate supported by a stage in an alignment process using a sensor; comprising:
obtaining transmission data describing the transmission of alignment radiation onto the substrate;
obtaining position data relating to a stage position of said stage and/or a sensor position of said sensor; tuning the spectral characteristics of the transmission of the alignment radiation such that the transmission of the alignment radiation has improved spectral characteristics with respect to the that of the position data; and
determining the position based on said position data.

18. A method as claimed in clause 17, wherein said tuning the spectral characteristics of the alignment radiation is such that a principal spectral frequency of the transmission of the alignment radiation is better matched to a principal spectral frequency of the position data.

19. A method as claimed in clause 17 or 18, wherein said tuning comprises modulating the alignment radiation using one or more modulators within a path of the alignment radiation.

20. A method as claimed in clause 17, 18 or 19, wherein alignment radiation is transmitted to said substrate via a multimode fiber by scanning a focused radiation beam over an input facet of the multimode fiber to scramble spatial coherence of the radiation beam, said scanning including periods where the focused radiation beam is incident outside of a core region of the input facet.

21. A method as claimed in clause 20, wherein said tuning comprises tuning the scanning speed of the focused radiation beam on the input facet.

22. A method as claimed in clause 21, comprising correcting an accuracy error for said tuning resultant from a phase difference between the position data and the scanning speed.

23. A computer program comprising computer readable instruction operable to perform the method of any preceding clause.

24. A processor and associated storage medium, said storage medium comprising the computer program of clause 23 such that said processor is operable to perform the method of any of clauses 1 to 22.

25. A metrology device comprising the processor and associated storage medium of clause 24 so as to be operable to perform the method of any of clauses 1 to 22.

26. A metrology device as claimed in clause 25, comprising a radiation source arrangement for providing alignment radiation, said radiation source arrangement comprising:
a coherent radiation source operable to emit a coherent beam of radiation;
a multimode fiber for transporting the alignment radiation to the metrology device; and
a scanning component operable to scan said coherent beam of radiation over an input facet of the multimode fiber to scramble spatial coherence of the radiation beam.

27. A lithographic apparatus, comprising:
a patterning device stage for supporting a patterning device;
a substrate stage for supporting a substrate;
a first metrology device comprising the metrology device of clause 25 or 26 and being operable to determine an aligned position for one or both of the patterning device support and substrate support;
and
a second metrology device for measuring a position of one or both of the patterning device stage or substrate stage.

There may be an accuracy error using such a method, depending on the phase difference between the SPM and the coherence scrambler scan. This error is expected to stay constant over a time interval of the order of the reciprocal of the SPM bandwidth. This accuracy error is expected to be correctable, and may be corrected by, for example:

1) Depending on the phase stability and bandwidth of the SPM signal, the standard calibration on a fiducial or on a different grating may be sufficient to calibrate the error out.
2) The phase of the coherence scrambler scanning mechanism can be maintained in synchronization with the phase of the SPM.
3) The starting time of the image acquisition process can be maintained in synchronization with the SPM signal.
4) The constant calibration error can be corrected using the SPM recorded data obtained using the method of the first embodiment described above. Due to the lock in technique, this correction does not need to be repeated at every image acquisition, but only at intervals of the order 1/(SPM bandwidth)

While the above methods are described for use with a metrology device as illustrated in FIG. 5, it may be used for any other suitable metrology device which has only periodic transmission of alignment radiation, such as a metrology device comprising a coherence scrambling arrangement as described herein. As such, any mention of alignment mark may be taken to encompass and refer to any target structure being measured, whether a dedicated metrology/alignment structure formed for the purpose of being measured or product structure having characteristics suitable for use in metrology.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens" and "objective", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for determining a position of a target structure on a substrate supported by a stage in an alignment process using a sensor; comprising:
    obtaining transmission data describing the transmission of alignment radiation onto the substrate;
    obtaining position data relating to a stage position of said stage and/or a sensor position of said sensor;
    determining a weighting for the position data based on said transmission data; and
    determining the position of the target structure based on said transmission data, position data and weighting.

2. The method of claim 1, wherein the position data relates to a correction for positioning and/or movement of the stage with respect to an expected position and/or movement.

3. The method of claim 2, wherein the expected position and/or movement is determined in said alignment process.

4. The method of claim 1, wherein the weighting weighs against said position data corresponding to time periods for which alignment radiation is not being transmitted onto the substrate.

5. The method of claim 1, wherein alignment radiation is transmitted to said substrate via a multimode fiber by scanning a focused radiation beam over an input facet of the multimode fiber to scramble spatial coherence of the radiation beam, said scanning including periods where the focused radiation beam is incident outside of a core region of the input facet.

6. The method of claim 5, wherein said obtaining transmission data comprises determining the transmission data via simulation using a light source model of the alignment radiation.

7. The method of claim 5, wherein said obtaining transmission data comprises directly measuring the amount of light being transmitted through the fiber and/or reflected from the fiber using a detector.

8. The method of claim 7, wherein the direct measurement is via a light tap in the multimode fiber.

9. The method of claim 7, wherein the direct measurement is via a branch downstream of an output of the multimode fiber.

10. The method of claim 7, comprising accounting for source intensity variation when determining said weighting.

11. The method of claim 5, wherein said obtaining transmission data comprises measuring the transmission data offline by measuring the transmission data at an output of the multimode fiber when not connected.

12. The method of claim 5, further comprising tuning spectral characteristics of said transmission of the alignment radiation such that the transmission of the alignment radiation has improved spectral characteristics with respect to that of the position data.

13. The method of claim 12, wherein said tuning the spectral characteristics of the alignment radiation is such that a principal spectral frequency of the transmission of the alignment radiation is better matched to a principal spectral frequency of the position data.

14. The method of claim 12, wherein said tuning comprises modulating the alignment radiation using one or more modulators within a path of the alignment radiation.

15. The method of claim 12, wherein said tuning comprises tuning the scanning speed of the focused radiation beam on the input facet;
    a first metrology device configured to determine an aligned position for one or both of a patterning device support and a substrate support; and
    a second metrology device configured to measure a position of one or both of a patterning device stage or a substrate stage.

* * * * *